(12) United States Patent
Li et al.

(10) Patent No.: US 7,498,645 B2
(45) Date of Patent: Mar. 3, 2009

(54) EXTREME ULTRAVIOLET (EUV) DETECTORS BASED UPON ALUMINUM NITRIDE (ALN) WIDE BANDGAP SEMICONDUCTORS

(75) Inventors: Jing Li, Manhattan, KS (US); Zhaoyang Fan, Manhattan, KS (US); Jingyu Lin, Manhattan, KS (US); Hongxing Jiang, Manhattan, KS (US)

(73) Assignee: III-N Technology, Inc., Lubbock, TX (US)

( * ) Notice: Subject to any disclaimer, the term of this patent is extended or adjusted under 35 U.S.C. 154(b) by 0 days.

(21) Appl. No.: 11/867,463

(22) Filed: Oct. 4, 2007

(65) Prior Publication Data

US 2008/0087914 A1    Apr. 17, 2008

Related U.S. Application Data

(60) Provisional application No. 60/849,394, filed on Oct. 4, 2006.

(51) Int. Cl.
*H01L 31/0304* (2006.01)
*H01L 21/18* (2006.01)

(52) U.S. Cl. .................. 257/431; 438/93; 257/E31.04; 257/E31.019

(58) Field of Classification Search ................. 257/431, 257/E31.04, E31.019; 438/93
See application file for complete search history.

(56) References Cited

U.S. PATENT DOCUMENTS

| | | | | |
|---|---|---|---|---|
| 4,614,961 | A * | 9/1986 | Khan et al. | ................. 257/453 |
| 6,104,074 | A * | 8/2000 | Chen | .......................... 257/453 |
| 6,265,727 | B1 * | 7/2001 | Kozodoy et al. | .............. 257/21 |
| 6,483,130 | B1 * | 11/2002 | Yang et al. | ................... 257/189 |
| 6,495,894 | B2 * | 12/2002 | Shibata et al. | .............. 257/428 |
| 6,597,023 | B2 * | 7/2003 | Shibata et al. | .............. 257/184 |
| 2006/0175681 | A1 * | 8/2006 | Li | .............................. 257/613 |
| 2006/0273325 | A1 * | 12/2006 | Surya | .......................... 257/79 |

OTHER PUBLICATIONS

Motogaito, Atsushi, et al. "Characterization of III-Nitride Based Schottky UV Detectors With Wide Detectable Wavelength Range (360-10nm) Using Synchrotron Radiation," Mat. Res. Soc. Proc. vol. 798, pp. Y6.6.1-Y6.6.6, 2007.

* cited by examiner

*Primary Examiner*—Evan Pert
(74) *Attorney, Agent, or Firm*—Lathrop & Gage LLP

(57) ABSTRACT

Disclosed are detector devices and related methods. In an AlN EUV detector a low temperature AlN layer is deposed above an AlN buffer layer. In one embodiment, the low temperature AlN layer is deposed at about 800° C. Pulsed $NH_3$ is used when growing an AlN epilayer above the low temperature layer. Numerous embodiments are disclosed.

6 Claims, 13 Drawing Sheets

[Cancelled]

[Cancelled]

EXTREME ULTRAVIOLET (EUV) DETECTORS BASED UPON ALUMINUM NITRIDE (ALN) WIDE BANDGAP SEMICONDUCTORS

RELATED APPLICATIONS

This application claims benefit of U.S. Patent Application Ser. No. 60/849,394, filed Oct. 4, 2006, the disclosure of which is incorporated by reference herein.

BACKGROUND

UV astronomy is essential to studies ranging from our own galaxy to the edge of the Universe. The UV range supplies a richness of experimental data which is unmatched by any other domain for the study of hotter objects in the universe because it samples molecular, neutral and atomic gas at temperatures ranging from 10 to 105 K.

The performance of UV detectors has steadily improved over the last decades in many respects, and space surveillance applications have benefited from this evolution. Nevertheless, current solid-state detectors designed for EUV observations (ranging approximately from 2 to 200 nm), are based on Si semiconductors and exhibit a few major drawbacks that are difficult to overcome within silicon technology. Because EUV signal is more than 5 orders of magnitude weaker than the visible counterpart, Si based charge coupled devices (CCDs) must be used in conjunction with filters in order to screen the visible background, which not only attenuate the EUV signal (and hence provide fairly low detectivity efficiency), but also require a sophisticate instrumentation design in order to suppress the visible background. Although cooling reduces the dark current and prevents degradations from ionizing radiations, it is a difficult and expensive solution in space missions. Si-based CCDs also degrade in space due to radiation damage.

Considering the general engineering requirements and constraints for space surveillance applications—reliability, radiation hardness, light weight, and minimal power usage, the next generation of space surveillance systems require orders-of-magnitude performance advances in detectors, detector arrays, and enabling technologies. AlN appears to be an ideal material for the development of EUV detectors, because AlN possesses the widest direct energy bandgap (~6.2 eV) among all semiconductors and offers the ability for bandgap engineering through the use of alloying and heterostructure design. AlN detectors would help to circumvent many of the limitations imposed by Si technology. The 6.1 eV bandgap permits the visible background to be intrinsically suppressed and the detectors to operate at room temperature, which drastically relive the harsh requirements on optical filters and cooling hardware and greatly simplify the system design. The compact crystal structure of AlN inherently provides radiation hardness.

It was demonstrated by Prof. Hiramatsu's group of Mie University in Japan that AlGaN ternary alloys out perform GaN in terms of photoresponsivity in the EUV and VUV region due to their wider energy band gaps and their result is shown in FIG. 1. For example, at λ<193 nm, the responsivity of $Al_{0.5}Ga_{0.5}N$ detectors is 16 times higher than that of GaN detectors due to the larger bandgap of $Al_{0.5}Ga_{0.5}N$ than GaN. Thus, it is expected that the detection efficiency of AlGaN based detectors in EUV and UVU region increases with an increase of the Al content and is highest for pure AlN.

BRIEF DESCRIPTION OF DRAWINGS

FIG. 15 shows the AlN Schottky diode EUV camera fabrication (vertical contacts).

FIG. 15A-I AlN Schottky diode EUV camera fabrication (vertical contacts). More specifically, FIG. 15A (material alone), FIG. 15B (Schottky contact array (Pt)), FIG. 15C (In bumps on pixel Pt Schottky contacts), FIG. 15D (diagram for one unit), FIG. 15E (flip-chip bonding to CMOS circuit), FIG. 15F (substrate is removed by ICP etching), FIG. 15G (top n-contacts (Ti/Al), and FIG. 15H (diagram for one unit). Advantages here are that the fabrication process is simplified. The disadvantage are EUV absorption by the top metal layer (very thin) and inability to anneal top contacts.

DETAILED DESCRIPTION OF THE INVENTION

Figure 1:
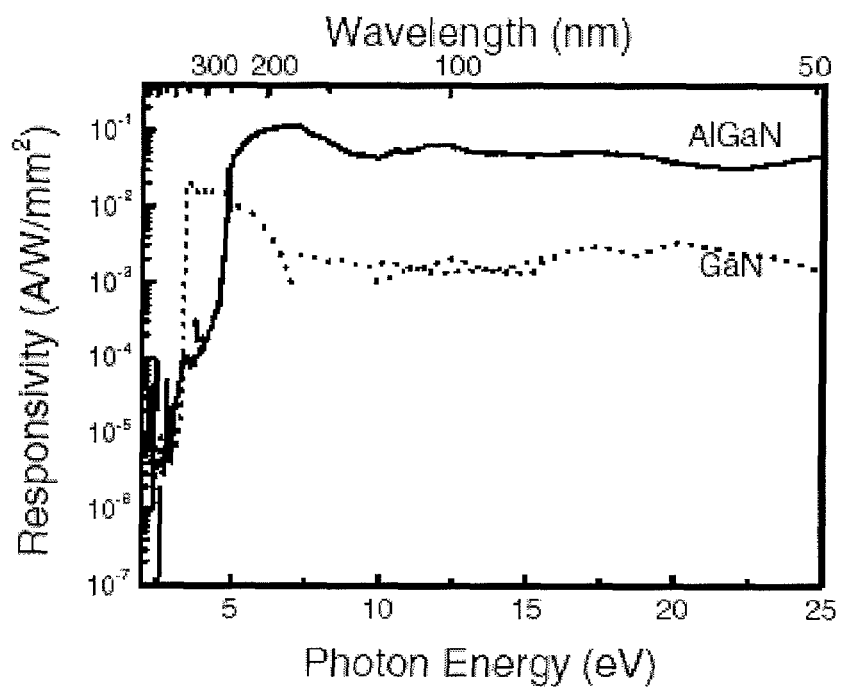
FIG. 1 shows responsivity spectra of GaN and $Al_{0.5}Ga_{0.5}N$ UV detector in UV and VUV region (2-25 eV). at λ<193 nm, the responsivity of $Al_{0.5}Ga_{0.5}N$ detector is 16 times higher than that of GaN detector.

FIG. 1 Responsivity spectra of GaN and $Al_{0.5}Ga_{0.5}N$ UV detector in UV and VUV region (2-25 eV). at $\lambda$<193 nm, the responsivity of $Al_{0.5}Ga_{0.5}N$ detector is 16 times higher than that of GaN detector.

In the past, Al-rich $Al_xGa_{1-x}N$ alloys (x>0.5) and pure AlN were known as excellent insulators due to their ultrahigh bandgaps, which limits the device design and functionality. Recently, it was demonstrated that AlN epilayers with an optical quality comparable to GaN can be grown on sapphire by metalorganic chemical vapor deposition (MOCVD). Several groups have also made significant progress toward the realization of conductive AlGaN alloys with high Al contents. Furthermore, it was also shown that it is possible to obtaine n-type AlN with Si doping. More recently, light emitting diodes (LED) based upon pure AlN with an emission wavelength of 210 nm has been demonstrated. These recent progresses have demonstrated the high promise of AlN as an active material for optoelectronic device applications. Many groups have previously demonstrated UV photodetectors based upon AlGaN alloys with superior performance. However, the shortest cut-off wavelength achieved with AlGaN so far is 229 nm.

Feasibility Demonstration

By innovating the MOCVD growth process, we have demonstrated the operation of metal-semiconductor-metal (MSM) photodetectors detectors based upon pure AlN epilayers with a cut-off wavelength of about 200 nm and up to four orders of magnitude of deep UV to near UV/visible rejection ratio. To our knowledge, this is so far the shortest cut-off wavelength achieved for semiconductor detectors without the use of optical filters. Based on the prior demonstration of Al0.5Ga0.5N EUV detector by A. Motogaito, et al., the fact that AlN has the largest energy band gap among the AlGaN alloys, and our recent demonstration of 200 nm AlN based MSM deep UV detectors described in more details below, we believe that AlN holds high promise for EUV and VUV detection applications. Thus, the intention of this disclosure is to disclose the idea of using AlN as EUV detector materials.

MOCVD Growth Process Innovation

For AlN EUV detector, the AlN epilayer quality is still the most important issue. In order to improve the UV and visible rejection ratio and decrease the dark current, we have devoted our effort to optimize the growth conditions for obtaining AlN epilayers with improved quality. We have incorporated the following modifications.

Insertion of a Low Temperature Layer

Figure 2:
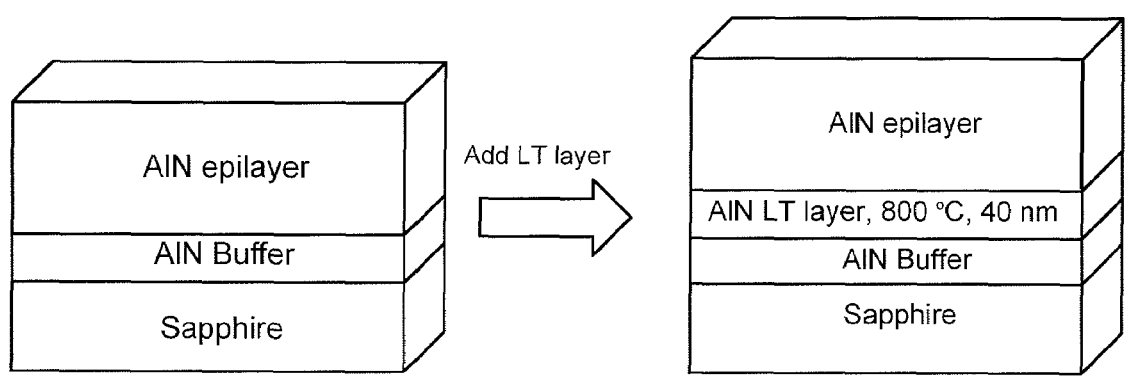
FIG. 2 shows AlN epilayers with (a) previous and (b) newly improved layer structure.

FIG. 2 shows the layer structures of a (a) conventional AlN epilayer and (b) improved AlN epilayer utilized for MSM detector fabrication. By inserting one more layer of AlN grown at an intermediate temperature (for example grown at 800° C.) in between the low temperature buffer (AlN buffer) and the top active AlN layers, we found that the subsequent active AlN epilayers have a better surface morphology and fewer cracks, which allowed us to improve the device performance.

Pulsed $NH_3$ Growth

Figures 3, 4A, 4B:
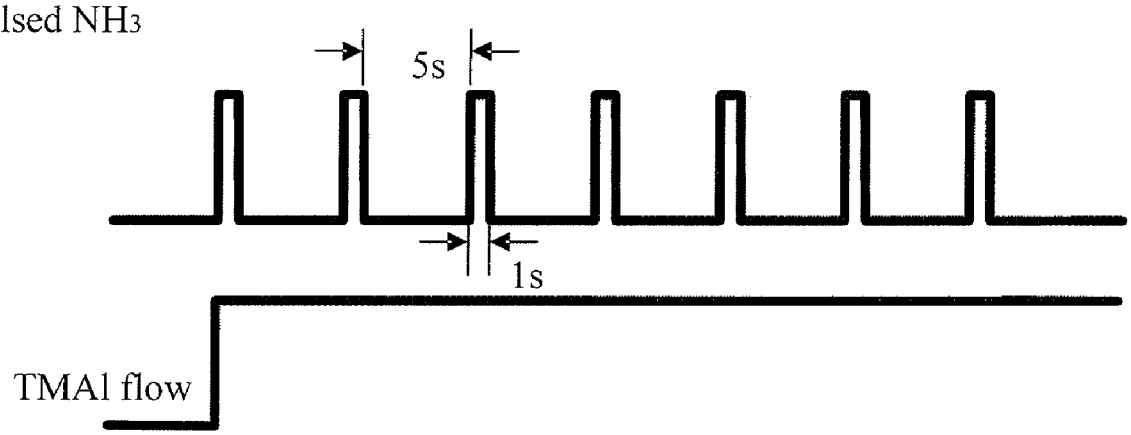
FIG. 3 shows AlN epilayer growth with pulsed $NH_3$
FIG. 4A and FIG. 4B have been cancelled.

For AlN epilayer growth, the pre-reaction between Trimethylaluminium (TMAl) and blue ammonia (NH3) during the growth is a big problem. The by-products of the pre-reaction deposited on the growth surface cause rough surface and higher crystalline defect density. By using pulsed NH3 during AlN growth, the possibility of this pre-reaction is dramatically reduced. FIG. 3 shows the growth procedure of pulsed NH3 growth. During the pulsed growth process, the TMAl flow was kept constant while NH3 flow was pulsed on for one second and off for five seconds.

Optical Characterization

Figure 5:
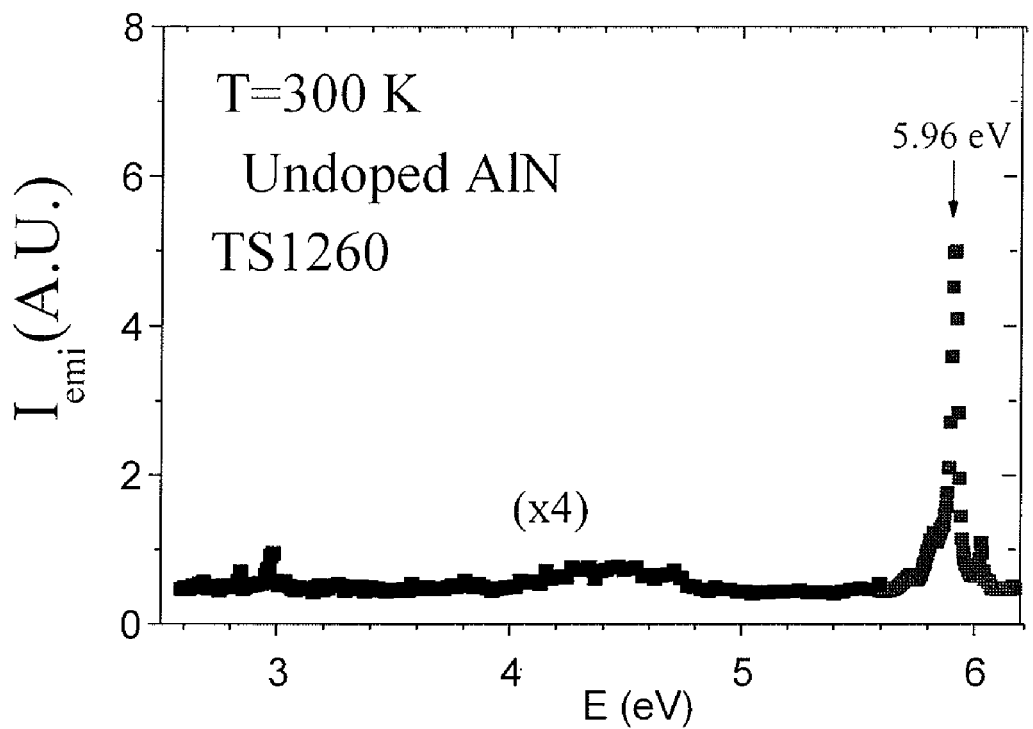
FIG. 5 shows PL spectrum of new structure AlN epilayer measured at 300 K.

In general, the presence of defects and impurities will decrease the UV to visible rejection ratio and increase the leakage current. We employed deep UV photoluminescence (PL) spectroscopy to investigate the optical properties of AlN epilayers. The optical quality of our AlN epilayers has improved with the use of the optimized growth conditions and layer structures. In FIG. 5, the room temperature PL spectrum shows that AlN epilayers emit predominantly the band-edge emission and virtually no impurity transitions in the near UV and visible region—implying very high optical quality.

MSM Detector Fabrication and Characterization

Figure 6:
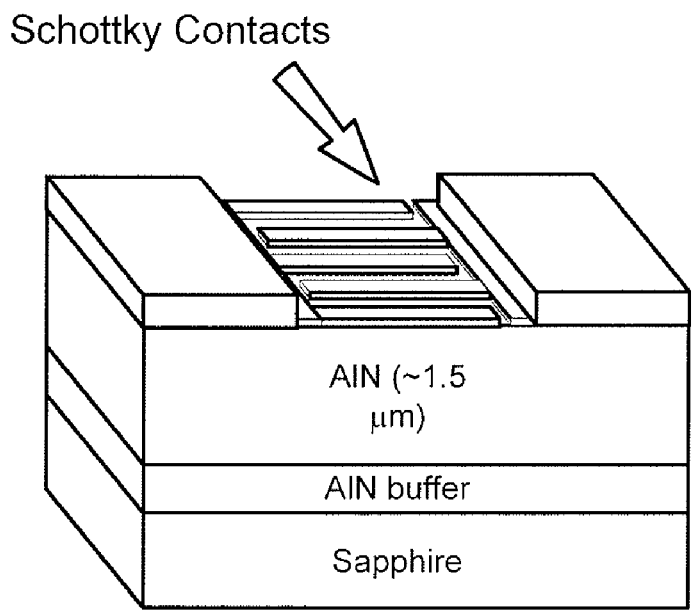
FIG. 6 shows the basic layout of a fabricated AlN MSM photodetector.

We have fabricated MSM detectors using these improved AlN epilayers. We employed interdigital finger structure for the active area and fabricated AlN MSM detectors with Pt as Schottky contacts. The basic device layout is schematically shown in FIG. 6(*a*), which utilizes an AlN epilayer as an active layer. FIG. 6(*b*) shows the optical microscopy image of a fabricated device with an active area of $80 \times 80$ $\mu m^2$ and a finger width of 2 $\mu m$ and spacing of 4 $\mu m$.

I-V Characterization

Figure 7:
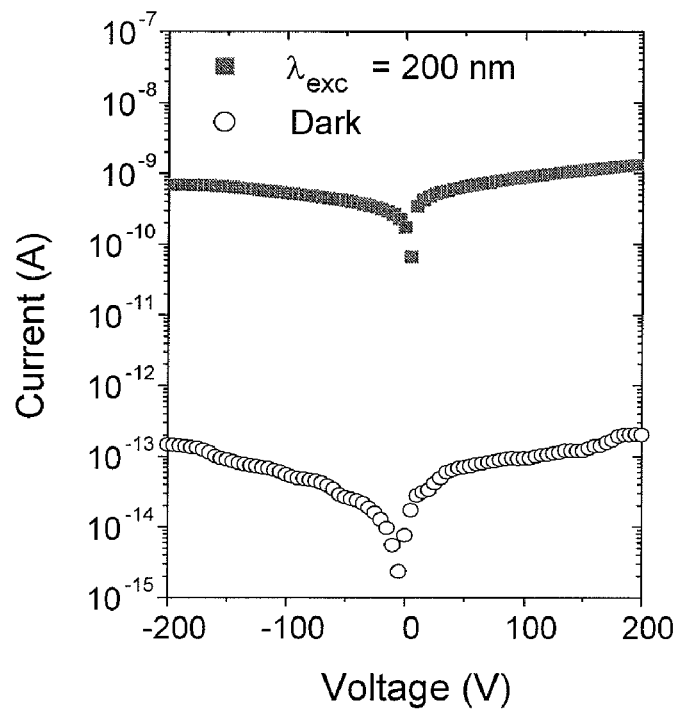
FIG. 7 shows the I-V characteristics of an AlN MSM detector under dark (open circles) and light excitation $\lambda_{exc}$=200 nm (closed squares)

FIG. 7 shows the typical I-V characteristics of the AlN MSM detectors under dark and 200 nm light excitation, respectively. The devices exhibit a very low dark current (about 100 fA at a bias voltage of 200 V). The devices also exhibit virtually no sign of breakdown up to a bias voltage of 200 V (our system limit). The response current of the AlN MSM detector increases by about 4 orders of magnitude even at near 0 V bias under 200 nm light excitation. We believe that these characteristics are direct attributes of the outstanding material properties of AlN, including large energy bandgap, dielectric constant and mechanical strength.

Spectral Response

Figure 8:
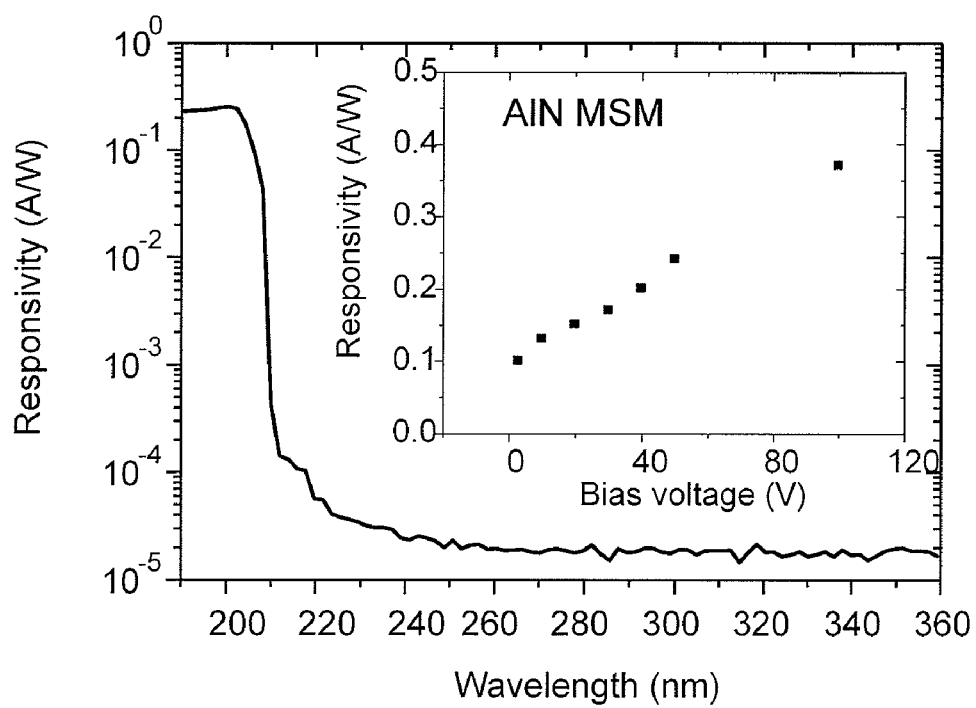
FIG. 8 The spectral response of an AlN MSM detector. The inset shows the detector responsivity as a function of the applied bias voltage.

The spectral response at 30 V bias voltages is shown in FIG. 8. These AlN MSM detectors exhibit a peak responsivity at 200 nm, an extremely sharp cut-off wavelength around 207 mm and more than 4 orders of magnitude DUV to near UV/visible rejection ratio as probed by our system setup. The detector responsivity increases almost linearly with the bias voltage, as illustrated in the inset of FIG. 8. The responsivity varies from 0.1 to about 0.4 A/W when the bias voltage is increased from 0 to 100 V. To our knowledge, this is so far the shortest cut-off wavelength achieved for semiconductor detectors.

Basic Device Structures for EUV and VUV Detectors

We intend to disclose three basic detector structures based upon AlN. All of the structures are grown epitaxially on AlN epilayer templates on suitable substrates. We envision several distinctive advantageous features of the detector structures by incorporating highly resistive undoped (or intrinsic) AlN epilayer ($>10^{12}$ cmΩ) as template. By doing so, parasitic conduction and trapping density in the detector structure and leakage current will be eliminated and the sensitivity and device stability will be improved. Furthermore, the insertion of a high quality AlN epilayer template prior to the subsequent growth of device layers will also reduce defect density and enhance doping efficiency in AlN Schottky barrier and p-i-n detector structures. Furthermore, due to the compact crystal structure and elimination of alloy effects, Schottky contacts formed directly on AlN can provide very low leakage current and high breakdown voltage.

Basic AlN MSM Detector Epitaxial Layer Structure

Figure 9:
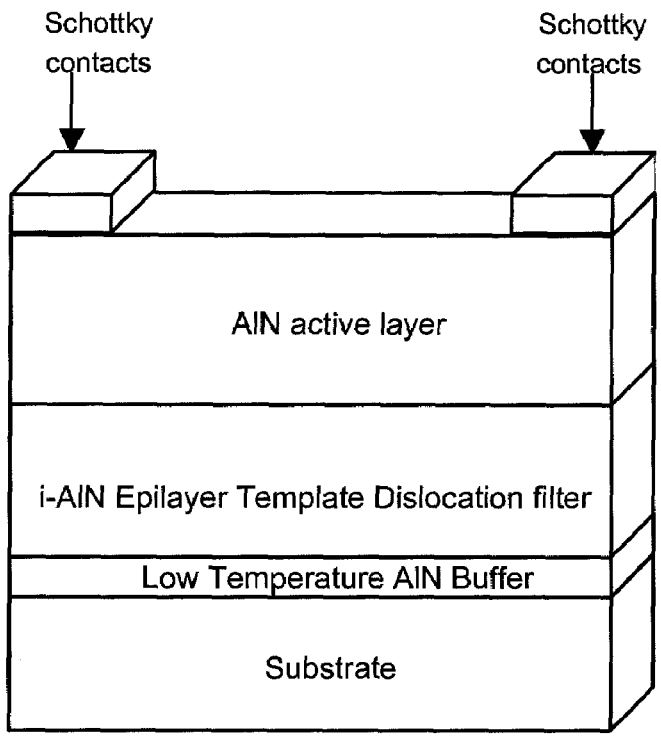
FIG. 9 EUV and VUV detector layer structure based upon AlN. One may add more intermediate layer to further enhance the material quality and device performance. Substrate includes sapphire, silicon, SiC, AlN bulk crystal, and other substrates that are suitable for AlN growth.

MSM detector structure is the simplest one to construct. MSM detectors possess desirable features such as high gain, low dark current, high speed, large bandwidth and high sensitivity. Some of these outstanding attributes have been demonstrated in section II (Feasibility demonstration) above. FIG. 9 is a schematic view of a basic AlN MSM detector structure we wish to disclose.

Basic AlN Schottky Diode Detector Structure

Figure 10:
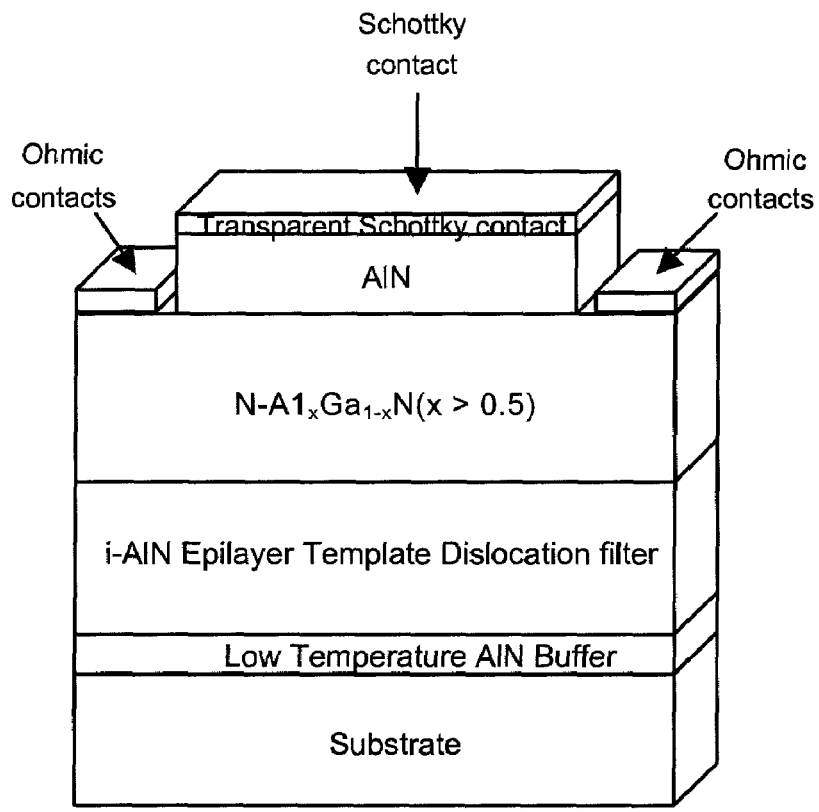
FIG. 10 EUV and VUV detector layer structure based upon AlN Schottky diode. The n-type $Al_xGa_{1-x}N$ includes n-type AlN. One may add more intermediate layer to further enhance the material quality, reduce n-type contact resistance and improve device performance. Substrate includes sapphire, silicon, SiC, AlN bulk crystal, and other substrates that are suitable for AlN growth.

Schottky barrier detectors are particularly attractive due to their unipolar structure. Schottky barrier detectors are majority carrier devices and do not suffer from minority carrier diffusion, Schottky barrier photodiodes may outperform other types of detectors in terms of UV/visible ratio, temperature dependence and non-linearity with incident power. FIG. 10 is a schematic view of a basic AlN Schottky diode detector structure we wish to disclose.

Basic AlN P-i-n Detector Structure

Figure 11:
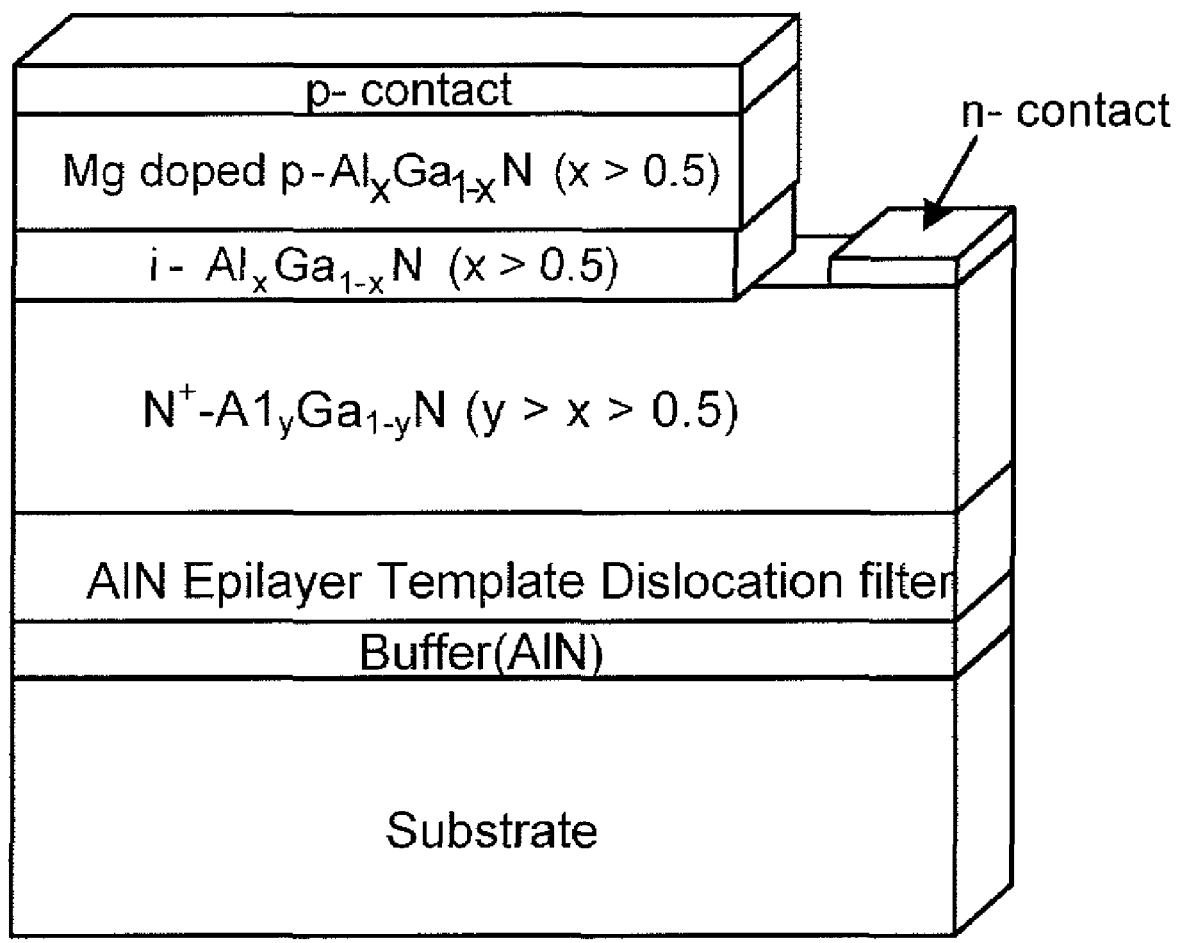
FIG. 11 EUV and VUV detector layer structure based upon AlN p-i-n structure. Here $Al_xGa_{1-x}N$ includes AlN. One may add more intermediate layer to further enhance the material quality, reduce n- and p-type contact resistances, and improve device performance. Substrate includes sapphire, silicon, SiC, AlN bulk crystal, and other substrates that are suitable for AlN growth.
Figure 12A:
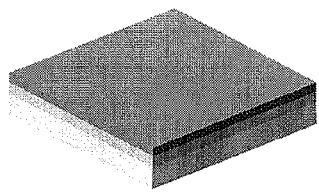
FIG. 12A-I shows the AlN MSM EUV Camera Fabrication Steps (Lateral Contacts). More specifically, FIG. 12A (material alone), FIG. 12B (Schottky array added), FIG. 12C (metal net added), FIG. 12D (in bumps on pixel Pt Schottky contacts), FIG. 12E (diagram for one unit), FIG. 12F (flip-chip bonding to CMOS read out circuit), FIG. 12G (substrate is removed by ICP etching), FIG. 12H (i-AlN removal by ICP etching), and FIG. 12I (diagram for one unit). It should be noted that the isolation between pixels is accomplished through Schottky pixel arrays. There is no need to employ etching.
Figure 12B:
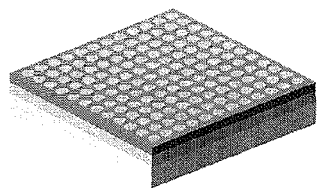
Figure 12C:
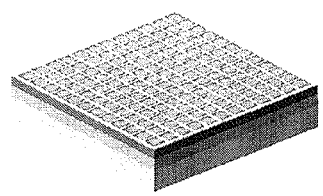
Figure 12D:
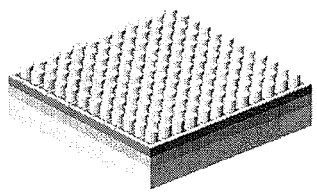
Figure 12E:
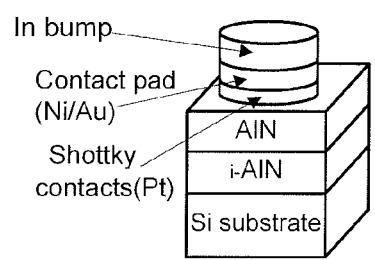
Figure 12F:
Figure 12G:
Figure 12H:
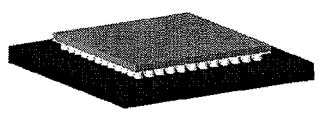
Figure 12I:
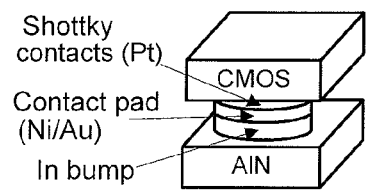
Figure 13A:
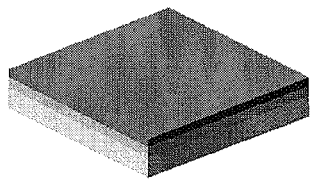
FIG. 13A-I AlN MSM EUV camera fabrication (vertical contacts). More specifically, FIG. 13A (material alone), FIG. 13B (Schottky contact array (Pt)), FIG. 13C (In bumps on pixel Pt Schottky contacts), FIG. 13D (diagram for one unit), FIG. 13E (flip-chip bonding to CMOS read out circuit), FIG. 13F (substrate is removed by ICP etching), FIG. 13G (i-AlN removal by ICP etching), FIG. 13H (depositing top contacts (Pt/Ni/Au)), and FIG. 13I (diagram for one unit). Advantages here are that the fabrication process is simplified. The disadvantage are EUV absorption by the top metal layer (very thin) and inability to anneal top contacts.
Figure 13B:
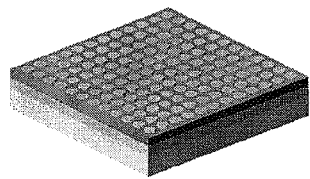
Figure 13C:
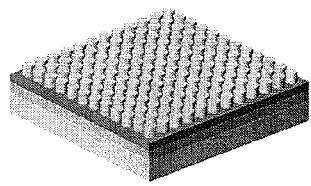
Figure 13D:
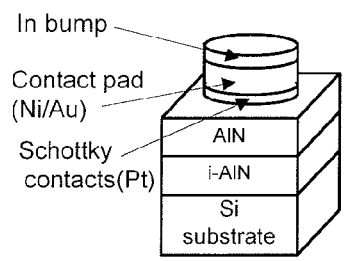
Figure 13E:
Figure 13F:
Figure 13G:
Figure 13H:
Figure 13I:
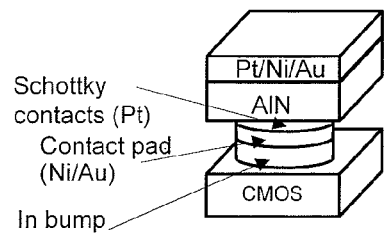
Figure 14A:
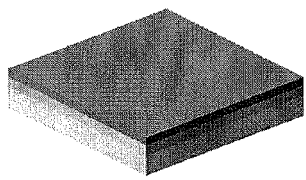
FIG. 14A-I AlN Schottky diode EUV camera fabrication (lateral contacts). More specifically, FIG. 14A (material alone), FIG. 14B (mesa etch stop at n-Al(Ga)N), FIG. 14C (deposit Ti/Al n-contacts), FIG. 14D (Schottky contact array (Pt)), FIG. 14E (In bumps on pixel Pt Schottky contacts), FIG. 14F (diagram for one unit), FIG. 14G (flip-chip bonding to CMOS circuit), FIG. 14H (substrate is removed by ICP etching), and FIG. 14I (i-AlN removal by ICP etching).
Figure 14B:
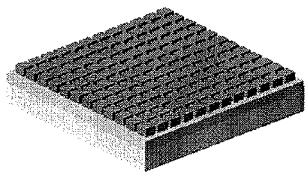
Figure 14C:
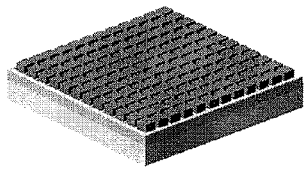
Figure 14D:
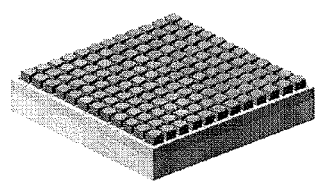
Figure 14E:
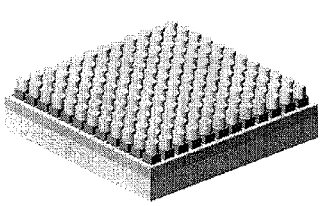
Figure 14F:
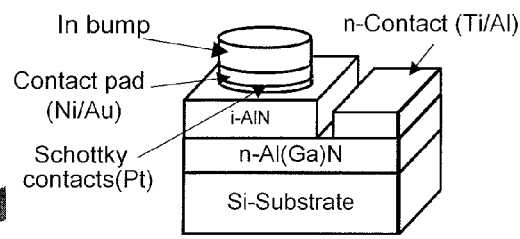
Figure 14G:
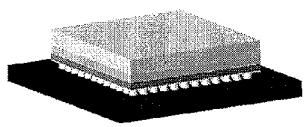
Figure 14H:
Figure 14I:
Figure 15A:
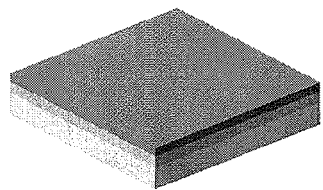
Figure 15B:
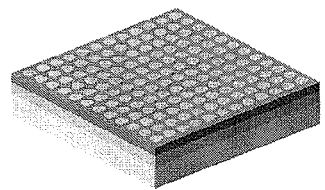
Figure 15C:
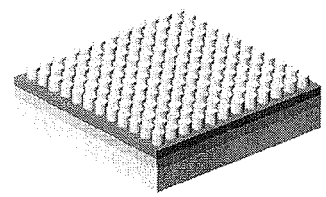
Figure 15D:
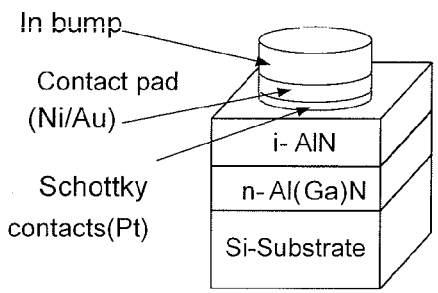
Figure 15E:
Figure 15F:
Figure 15G:
Figure 15H:
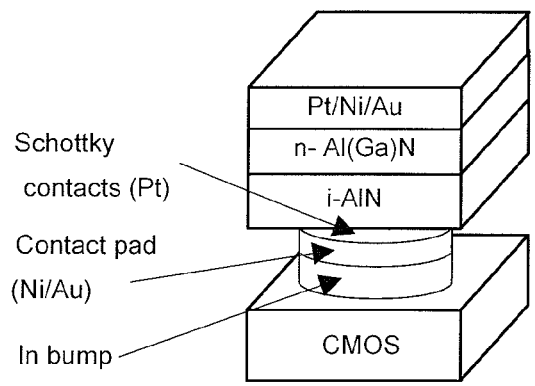

P-i-n detector structures are expected to provide highest level of performance. Advantageous features of p-i-n detector structures include: 1) very low dark current due to large potential barrier, 2) high operation speed, 3) direct control of quantum efficiency and speed through the control of the thickness of the intrinsic (i) layer, and 4) the device can operate under very low bias. FIG. 11 is a schematic view of a basic AlN p-i-n detector structure we wish to disclose.

AlN EUV Detector Array Architectures

We intend to disclose basic architectures for the construction of AlN EUV and VUV detector arrays, which are the basis of future AlN EUV cameras. Below, we illustrate examples of array fabrication for device structures grown on Si substrates. However, the same approach can be applied to detector structures grown on other substrates, which eventually can be removed by etching. More detailed fabrication procedures are also described for the AlN MSM detector structure and AlN Schottky diode structure. However, the descriptions can be extended and slightly modified to the fabrication of EUV detector arrays based upon AlN p-i-n detector structures.

Detailed Description of Fabrication of EUV Detector Array (Camera) Based Upon AlN MSM Structure (Lateral—FIG. 12)

Below, we provide a more detailed fabrication procedure description for the AlN MSM detector structure grown on Si substrate. However, the descriptions can be extended and slightly modified to the fabrication of EUV detector arrays based upon AlN Schottky diodes and p-i-n detector structures. Furthermore, the same approach can also be applied to detector structures grown on other substrates, which eventually can be removed by etching.

Layer Structure

Figure 16:
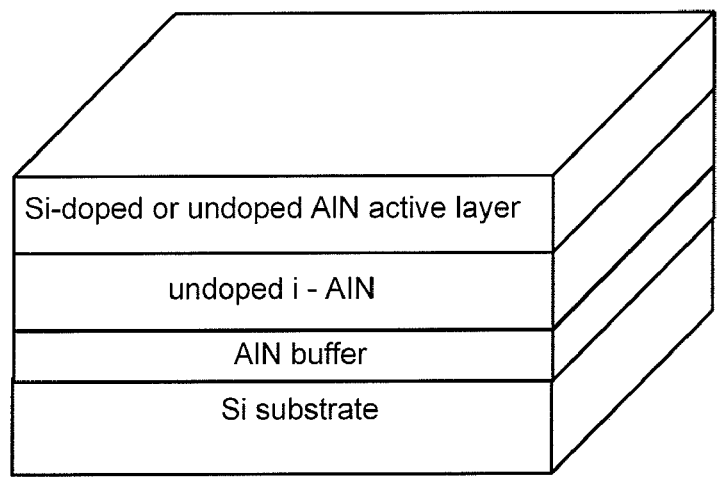
FIG. 16 Device layer structure

The basic layer structure of an AlN MSM detector structure grown on Si substrate is shown in FIG. 16 and FIG. 9. Si substrate with (111) orientation is used for the easy removal in the late device processing stage as illustrated in FIGS. 12-15.

Fabrication Procedures

Figure 17:
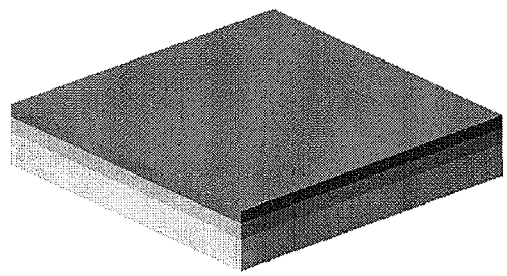
FIG. 17 AlN active layer grown on Si substrate

FIG. 17 represents the starting material or layer structure as that shown in FIG. 16 for detector array fabrication.

Schottky Contact Array Formation

Figure 18:
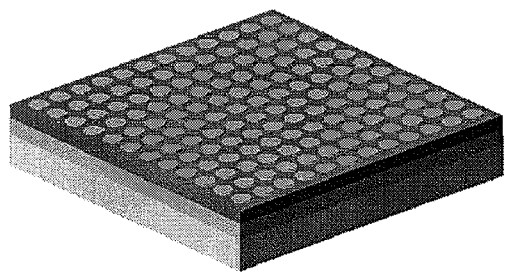
FIG. 18 Schottky contact array (Pt) formation

To make the AlN MSM detector array, first we need to make Schottky contact array on the AlN/Si starting wafer. The Schottky contact array is made by depositing Pt metal with circular shape. As Schottky contacts for AlN detector, Pt metal can form high performance Schottky contacts on AlN epilayer, which provides high breakdown voltage and low leakage current, as demonstrated in section II (Feasibility demonstration). To form Schottky contacts, first a photo resist is used to define the array patterns, then metal Pt is deposited using e-beam evaporation and a lift-off technique is used to form the Schottky contact array. To obtain high quality Schottky contacts with low leakage current and high breakdown voltage, surface treatment before metal deposition is critical. Surface treatment with $NH_4OH$ and HF solution is a good way to obtain high quality contacts. The thickness of the Pt metal is also important. Typically, Pt with thickness of 6 nm is good enough to form Schottky contacts. FIG. 18 shows the schematic of the detector array after depositing Pt Schottky contact array.

Metal Net for the Second Contacts

Figure 19:
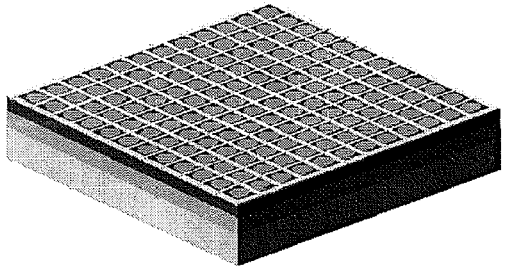
FIG. 19 Metal net formation (Ni/Au)

For detector structure, two metal pads are necessary for each pixel. Pt metal already forms one of the pads, and depositing Ni/Au metal forms the other pad. The Ni/Au pad is in a net form that makes the fabrication process fairly easy. FIG. 19 shows the schematic of the detector array after depositing Ni/Au metal net.

In Bumps for Flip Chip Bonding

Figure 20:
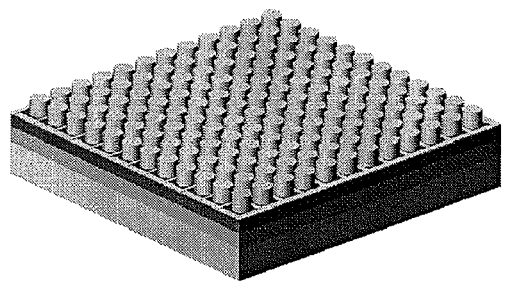
FIG. 20 In bumps on pixel Pt Schottky contacts

In order to bond the detector array onto a CMOS readout circuit by flip-chip bonding, we fabricate In bump on top of the Schottky contact array. FIG. 20 illustrates the detector array after depositing In bump on Pt Schottky contact pixels.

Unit Cell of a Pixel Detector

Figure 21:
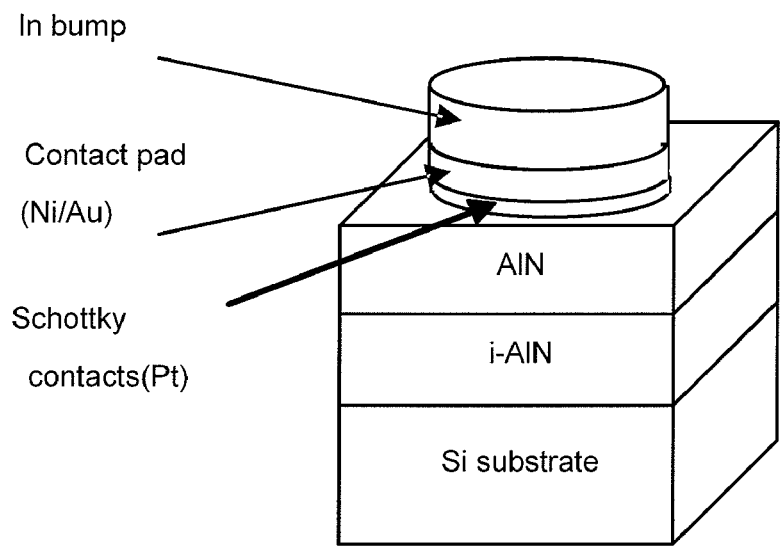
FIG. 21 diagram for one pixel

FIG. 21 shows the schematic of one pixel within the detector array

Flip-chip Bonding

Figure 22:
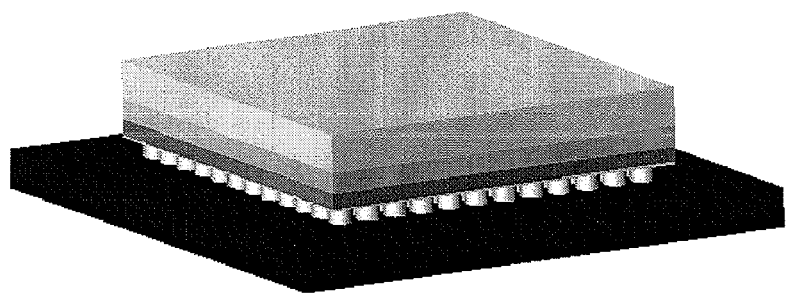
FIG. 22 flip-chip bonding to CMOS circuit
Figures 23, 24:
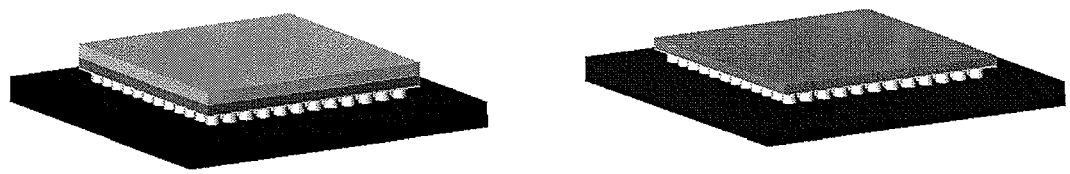
FIG. 23 Si substrate removal by ICP etching
FIG. 24 ud-AlN remove by ICP etching

Flip-chip bonding is a very good approach to bond two different devices. It makes good contact between two device parts and is also excellent for dissipating heat in devices through submount. FIG. 22 shows the schematic of the detector array after flip-chip bonding to a CMOS readout circuit Si Substrate Removal After flip-chip bonding the detector array and the CMOS readout circuit, Si substrate on the detector array side will block the EUV light, so the Si substrate has to be removed from the detector array. By ICP (Inductively Coupled Plasma) etching with $SF_6$ gas, Si substrate can be easily removed. $SiF_6$ based ICP etching provides high etching rate (up to 10 μm/min) on Si and generates virtually no etching damage on AlN, which guarantees a complete Si substrate removal while keeps the AlN layer untouched. FIG. 23 shows the schematic of the detector array after Si substrate removal.

Removal of Undoped i-AlN

The thick AlN epilayer template may also block the EUV light transferred to the active area. In order to improve the detector performance, further reduction in AlN epilayer template thickness may be necessary. By using $Cl_2$ based ICP etching, we can reduce and control the thickness of AlN epilayer template in the final stage of the array fabrication. FIG. 24 shows the schematic of the completed EUV camera after the removal of the undoped i-AlN epilayer template.

Finished Pixel Within the Detector Array

Figure 25:
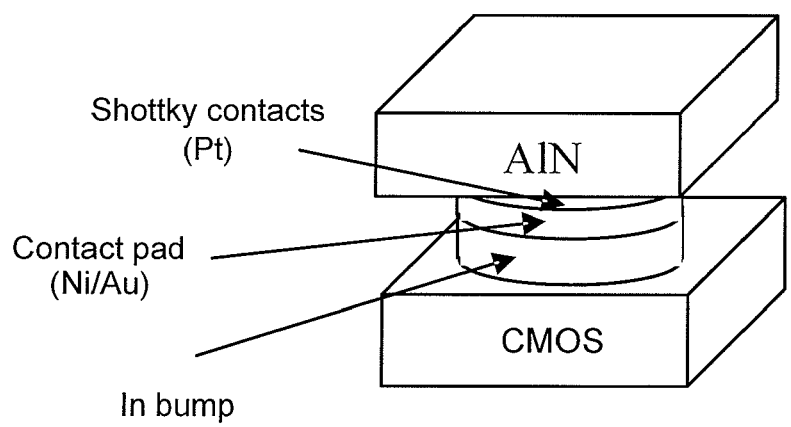
FIG. 25 Diagram for one pixel

For the finished devices, each pixel unit is schematically shown in FIG. 25.

The invention claimed is:

1. A method of making a detector device comprising:
   providing a substrate;
   depositing an AlN buffer layer above said substrate;
   depositing an intermediate AlN epilayer above said buffer layer; and
   depositing an active AlN epilayer above said intermediate AlN layer, said AlN buffer layer being deposited at a lower temperature than said intermediate AlN epilayer; said intermediate AlN epilayer being deposited at a lower temperature than said active AlN epilayer.

2. The method of claim 1 wherein said depositing of said intermediate AlN layer is executed at a temperature of approximately 800° C.

3. The method of claim 1 comprising:
   using pulsed $NH_3$ during said depositing said AlN epilayer step.

4. A detector device comprising:
   a substrate;
   an AlN buffer layer above said substrate;
   an i-AlN epilayer template disclocation filter layer located above said buffer layer;
   an AlN active layer above said disclocation filter layer; and
   at least one contacts arranged across said active layer;
   said detector device having a cut-off wavelength of about 200 nm.

5. A semiconductor ultraviolet detector, said detector comprising:
   a substrate;
   a plurality of successive layers of AlN; and
   said detector having a cut-off wavelength of about 200 nm.

6. A method of making a detector device comprising:
   providing a substrate;
   depositing an AlN buffer layer above said substrate;
   depositing an intermediate AlN epilayer above said buffer layer using pulsed $NH_3$; and
   depositing an active AlN epilayer above said intermediate AlN layer.

* * * * *